United States Patent [19]
Mayama

[11] Patent Number: 5,812,958
[45] Date of Patent: Sep. 22, 1998

[54] ANTI-VIBRATION SYSTEM

[75] Inventor: Takehiko Mayama, Utsunomiya, Japan

[73] Assignee: Canon Kabushiki Kaisha, Tokyo, Japan

[21] Appl. No.: 410,492

[22] Filed: Mar. 24, 1995

[30] Foreign Application Priority Data

Mar. 25, 1994 [JP] Japan .................................. 6-077831

[51] Int. Cl.$^6$ ........................................... F16F 15/02
[52] U.S. Cl. ........................................... 701/111; 364/508
[58] Field of Search ................... 364/431.08, 424.05, 364/430, 428.045, 424.047, 559, 508; 354/202; 33/568; 267/140.15, 140.11; 355/53; 378/34; 137/39; 188/378, 299, 267; 235/462; 68/23.2; 187/330; 318/568.1; 280/707; 248/550; 395/80–99; 901/36

[56] References Cited

U.S. PATENT DOCUMENTS 4,848,525  7/1989  Jacot et al. ............................ 188/378

FOREIGN PATENT DOCUMENTS 64-069839  3/1989  Japan ........................... F16F 15/02
6-117481   4/1994  Japan ........................... F16F 15/02

OTHER PUBLICATIONS

McElroy (English translation of Japanese Kokai patent application 64–069839, pp. 1–12), Oct. 1996.
McElroy (English translation of Japanese Kokai patent application 6–117481, pp. 1–26), Oct. 1996.

*Primary Examiner*—Emanuel Todd Voeltz
*Assistant Examiner*—Phallaka Kik
*Attorney, Agent, or Firm*—Fitzpatrick, Cella, Harper & Scinto

[57] ABSTRACT

An anti-vibration system includes an anti-vibration table on which a precise machine, having a driving device and having directions of freedom, is mounted, a plurality of supporting mechanisms for supporting the anti-vibration table and for suppressing vibration of the table, a plurality of actuators for applying a control force to the anti-vibration table, a vibration sensor for detecting vibration of the anti-vibration table, and a control device for actuating the actuators on the basis of an output of the vibration sensor to actively control vibration of the anti-vibration table. The actuators are disposed each in a direction forming a certain angle with respect to the directions of freedom of the precise machine. The angle is determined on the basis of a control force required to be applied by the actuators to the table to control the vibration of the table with respect to each direction of freedom of the precise machine. A drive reactive force to be applied to the anti-vibration table from the precise machine in response to the operation of the driving device, is distributed to the supporting mechanisms and the actuators.

5 Claims, 3 Drawing Sheets

ANTI-VIBRATION SYSTEM

FIELD OF THE INVENTION AND RELATED ART

This invention relates generally to an anti-vibration system and, more particularly, to an active anti-vibration system usable in an electronic microscope and a semiconductor exposure apparatus, for example.

Enhancement of the performance of precise anti-vibration systems has been desired with increasing preciseness of precise machines such as electronic microscopes or semiconductor exposure apparatuses, for example, which are to be mounted on the anti-vibration systems. Particularly, in semiconductor exposure apparatuses, designed to perform a correct and quick exposure operation, use of an anti-vibration table, capable of intercepting, as much as possible, external vibrations such as vibration of the floor, for example, is necessary. This is because, during the exposure process of a semiconductor wafer, an exposure X-Y stage has to be held in a completely stationary state. The exposure X-Y stage performs an intermittent motion (step-and-repeat motion), and this repeated stepwise motion excites vibration of the anti-vibration table itself. Thus, the anti-vibration table should have an anti-vibration performance to damp external vibration as well as vibration controlling performance to damp vibration produced by the motion of the machine itself mounted on that table.

As an attempt to meet such requirements, there has been developed an active anti-vibration system wherein vibration of an anti-vibration table is detected by sensors and wherein output signals of the sensors are compensated for and fed back to actuators so that active vibration control is executed. Such an active anti-vibration system may assure balanced anti-vibration performance and vibration controlling performance, which are difficult to accomplish with conventional passive anti-vibration systems that are composed of only supporting mechanisms exhibiting spring and damping performances.

FIGS. 3A and 3B show a known example of such a active anti-vibration system. This active anti-vibration system comprises vibration sensors 4a, 4b, 4c and 4d for detecting vibration in horizontal directions and actuators 3a, 3b, 3c and 3d for applying control forces in the horizontal directions, and these elements are provided at four corners of an anti-vibration table which is supported by supporting mechanisms through an anti-vibration function. Also, with regard to the vertical direction, there are vibration sensors 4e and 4f and actuators 3e and 3f. Any vibration of the anti-vibration table detected by these sensors is compensated for and fed back to the actuators, whereby motion of the anti-vibration table in six degrees of freedom thereof is controlled, such that anti-vibration performance to damp external vibrations as well as vibration controlling performance to vibration produced by the motion of the machine itself mounted on the table may be assured in good balance.

The operation of this active anti-vibration system will be explained below, taking as an example a case where an X-Y stage mounted on the anti-vibration table 1 and having an X stage 5, X stage driving means 6, a Y stage 7 and a Y stage driving means 8, is driven in the X direction. Here, the directions of freedoms of the X-Y stage are set to be orthogonal to each other.

As the X-Y stage is driven in the X direction, namely, as the X stage 5 is driven by the X stage driving means 6, due to the drive reactive force thereof, the anti-vibration table 1 vibrates mainly in the X direction. This vibration is detected by the vibration sensors 4b and 4d, for detecting vibration in the X direction, and, after being compensated for appropriately, it is fed back to the actuators 3b and 3d each disposed in the X direction and is controlled thereby. The drive reactive force of the X stage 5 may produce vibration of the anti-vibration table 1 in a rotational mode, such as pitching or yawing or vibration in the Y direction or vertical direction, and in that case it is controlled by means of the vibration sensor 4a, 4b, 4c, 4d, 4e or 4f and the actuator 3a, 3b, 3c, 3d, 3e or 3f, each being disposed in the horizontal or vertical direction. However, in the case where the X-Y stage is driven in the X direction, vibration in the X direction is dominant and thus, the active anti-vibration system is mainly under the control of the actuators 3b and 3d, each being disposed in the X direction.

Similarly, as the X-Y stage is driven in the Y direction, namely, as the Y stage 7 is driven by the Y stage driving means 8, vibration of the anti-vibration table 1 mainly in the Y direction due to the drive reactive force is detected mainly by the vibration sensors 4a and 4c, each disposed in the Y direction and, after being compensated for appropriately, it is controlled mainly by the actuators 3a and 3c each disposed in the Y direction.

In the structure of FIGS. 3A and 3B, vibration of the anti-vibration table is detected by vibration sensors, and it is compensated for and is fed back by which the vibration of the anti-vibration table is controlled actively. The active anti-vibration system may be additionally provided with a position sensor for detecting displacement of the anti-vibration table with respect to a reference position, and a signal with the displacement being compensated for may be added to vibration with the vibration sensor output being compensated, and the resultant may be fed back to the actuators, by which the vibration of the anti-vibration table as the well as displacement thereof with respect to the reference position may be controlled actively. Such an active anti-vibration system may operate substantially in the same manner as described above.

It is to be noted here that generally the control force required for providing such vibration controlling performance for controlling the vibration produced by the motion of the machine itself, is large as compared with the control force for providing anti-vibration performance for controlling a vibration, such as vibration of the floor, transmitted from the outside. Therefore, the actuator for applying the control force to the anti-vibration table 1, should have a sufficiently large control force to provide vibration controlling performance for controlling the vibration produced by the motion of the mounted machine itself.

SUMMARY OF THE INVENTION

As described, an active anti-vibration system may provide balanced anti-vibration performance to control an external vibration of an anti-vibration table and vibration controlling performance for controlling the vibration produced by the motion of the mounted machine itself. However, a precise machine which needs such an anti-vibration table generally has a large load weight and, therefore, it is necessary to apply a large control force to the anti-vibration table in order to control the vibration actively. Further, particularly in semiconductor exposure apparatuses, as the speed of the step-and-repeat motion of an X-Y stage mounted on an anti-vibration table increases, the drive reactive force becomes larger. Thus, in order to suppress the vibration of the machine itself to be produced thereby, the active anti-vibration system should provide a larger control force. In order to produce a larger control force, a larger size actuator or a larger number of actuators may be used. However, this directly leads to an increase in size or cost of the structure.

For producing a larger control force without enlargement of the size of the actuator or without use of additional actuators, the method disclosed in Japanese Laid-Open Patent Application, Laid-Open No. 69839/1989 (laid open on Mar. 15, 1989) can be used, wherein actuators are disposed obliquely with respect to an anti-vibration table. Also, there is a method disclosed in Japanese Patent Application No. 287070/1992 (filed in Japan on Oct. 2, 1992 in the name of the assignee of the subject application) wherein a certain angle is defined between the direction of freedom of a machine (such as an X-Y stage), having a driving means and being mounted on an anti-vibration table, and the direction of freedom of the anti-vibration system, by which any external force, such as a drive reactive force generated during the X-Y stage motion, is distributed to many actuators, such that actuator operation efficiency is enhanced and also the rigidity to the X-Y stage driving direction is enlarged. However, in Japanese Laid-Open Patent Application, Laid-Open No. 69839/1989, sufficient consideration has not been given to the drive reactive force of the machine mounted on the anti-vibration table and, therefore, it is difficult to compensate for increases in the speed of the step-and-repeat motion of the X-Y stage. Also, in the anti-vibration system of Japanese Patent Application No. 287070/1992, sufficient consideration has not been given to the difference in magnitude of the drive reactive forces, in respective directions of freedoms, of the machine mounted on the table and, thus, the direction of disposition of each actuator of the anti-vibration system is not completely optimized.

More specifically, Japanese Patent Application No. 287070/1992 proposes a method in which the angle of the direction of freedom of the machine mounted on an anti-vibration table and having a driving means and the direction of freedom of the anti-vibration system, is relatively shifted by $\pi/4$, by which the drive reactive force of the X-Y stage is distributed to many actuators. With this method, if the drive reactive forces of the X-Y stage in the X and Y directions are equal to each other, the maximum thrust of each actuator may be made a minimum, as necessary. If however the drive reactive forces in the X and Y directions are different from each other, it is not always possible to make the maximum thrust of each actuator a minimum, as necessary. If, for example, the drive reactive force in the Y direction is larger than that in the X direction, the maximum thrust of each actuator may not be reduced unless the angle between the Y axis and the direction of action of each actuator is set to be smaller than $\pi/4$.

Usually, a machine having driving means such as an X-Y stage, for example, has a structure that an X stage is mounted on a Y stage or, alternatively, a Y stage is mounted on an X stage, and there is a tendency for one of these two stages to have a larger drive weight and thus the drive reactive force in one of the directions of freedoms is larger. Also, in many cases, in each direction of freedom of the machine such as in each of X and Y directions, the drive reactive force during the drive of the X-Y stage has a specific pattern. Thus, in the driving of the machine mounted on the table, in order to reduce the thrust required for each actuator to apply a control force to the anti-vibration table, it is desirable that, in an active anti-vibration system wherein a certain angle is defined between the direction of freedom of a machine mounted on an anti-vibration table and having driving means and the direction of freedom of the anti-vibration system, such as the one disclosed in Japanese Patent Application No. 287070/1992, the direction of disposition of each actuator of the active anti-vibration system is optimized while taking into account the directions of freedoms of the mounted machine having driving means such as an X-Y stage, as well as the control force in each direction of freedom of the mounted machine required for the active anti-vibration system during the driving of the mounted machine.

It is accordingly an object of the present invention to assure that, in an active anti-vibration system, wherein vibration of an anti-vibration table, on which a precise machine having driving means is mounted, is detected and in which vibration control and vibration isolation are performed by means of a plurality of actuators, during the driving of the precise machine the maximum thrust required for each actuator is made a minimum as necessary without degrading basic functions, such as vibration controlling performance and anti-vibration performance.

In accordance with an aspect of the present invention, to achieve the above object, there is provided an active anti-vibration system wherein, in accordance with the directions of freedoms of a machine mounted on an anti-vibration table and having driving means, such as an X-Y stage, for example, and in accordance with the control force required for the active anti-vibration system with respect to each direction of freedom during the drive of the machine, a proper angle is defined between the direction of freedom of the mounted machine and the direction of disposition of each actuator of the active anti-vibration system by which an external force, such as drive reactive force, is distributed uniformly to a larger number of actuators and supporting mechanisms for supporting the anti-vibration table, regardless of the direction of drive of the mounted machine, such that the maximum thrust required for each actuator is made a minimum as necessary.

Usually, a machine having driving means such as an X-Y stage, for example, has a structure that an X stage is mounted on a Y stage or, alternatively, a Y stage is mounted on an X stage, and there is a tendency for one of the two stages to have a larger drive weight and thus the drive reactive force in one of the directions of freedoms is larger. Also, in many cases, in each direction of freedom of the machine such as in each of X and Y directions, the drive reactive force during the driving of the X-Y stage has a specific pattern. In the present invention, in consideration thereof, in accordance with the directions of freedoms of a machine mounted on an anti-vibration table and having driving means, such as an X-Y stage and in accordance with the control force required, with respect to each direction of freedom of the mounted machine, for the active anti-vibration system during driving of a machine mounted, the direction of disposition of each actuator of the anti-vibration system for applying the control force to the anti-vibration table is determined so as to make the maximum thrust required for each actuator a minimum, as necessary. For example, in an active anti-vibration system on which an X-Y stage having two orthogonal directions of freedoms is mounted, the direction of disposition of each actuator of the anti-vibration system may be determined in accordance with the arc tangent of the ratio of the maximum control force required for the active anti-vibration system in the driving of the mounted machine in each direction of freedom, so that the same maximum thrust may be required for each actuator in the case where the X-Y stage is driven in the X direction and in the case where it is driven in the Y direction. This assures that, regardless of the direction of driving of the mounted machine, an external force such as drive reactive force thereof is uniformly distributed to a larger number of actuators and supporting mechanisms, supporting the anti-vibration table, by which the maximum thrust required for each actuator for applying the control force to the anti-vibration table is made a minimum, as necessary. Thus, without enlarging the size of the actuator and without use of additional actuators, a larger control force as compared with that as attainable with conventional structures is provided in the direction of freedom of the mounted machine. Also, the actuator output may be decreased, and the cost of the constituent elements of the active anti-vibration system may be reduced.

In semiconductor exposure apparatuses, as the speed of the step-and-repeat motion of an X-Y stage mounted on an anti-vibration table increases, the drive reactive force becomes larger. With the present invention, since the maximum thrust required for each actuator for applying the control force to the anti-vibration table is made a minimum, as necessary, a larger control force than as attainable with conventional structures is obtainable in the direction of freedom of the mounted machine, without enlargement of the size of the actuator and without use of additional actuators. Thus, it is possible to compensate for an increase in the drive reactive force of the mounted machine such as an X-Y stage and to provide good vibration controlling performance.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
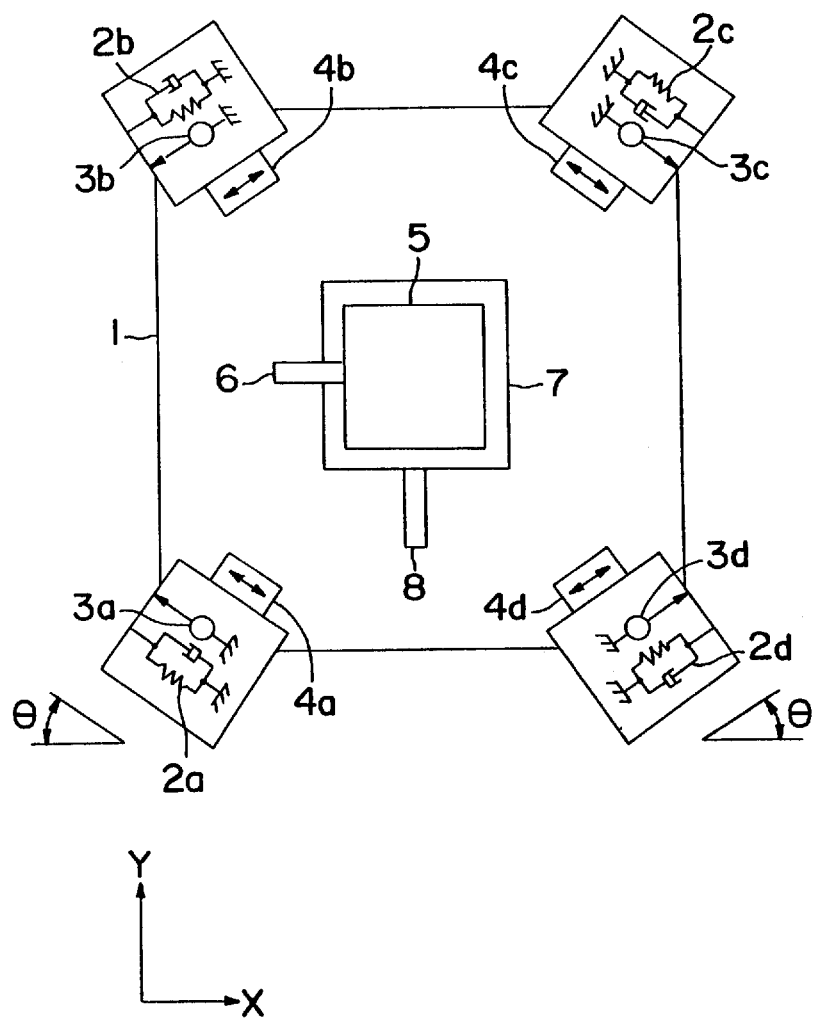
FIG. 1 is a top plan view, schematically showing an active anti-vibration system according to an embodiment of the present invention, wherein the freedom of movement of a machine mounted thereon are taken into account.

FIG. 1 is a top plan view, schematically showing an active anti-vibration system according to an embodiment of the present invention, wherein the freedom of movement of a machine mounted thereon are taken into account. The anti-vibration system of FIG. 1 comprises an anti-vibration table 1 on which a precise machine, such as a semiconductor exposure apparatus, for example, is mounted. The anti-vibration system further comprises supporting mechanisms 2a, 2b, 2c and 2d for supporting the anti-vibration table 1 and performing an anti-vibration function, and actuators 3a, 3b, 3c and 3d. The anti-vibration system further comprises vibration sensors 4a, 4b, 4c and 4d for detecting vibration of the anti-vibration table. The anti-vibration system further comprises an X stage 5, an X stage driving means 6, a Y stage 7 and a Y stage driving means 8 which are constituent elements of the precise machine, such as a semiconductor exposure apparatus mounted on the table. The X-Y stage has two degrees of freedom in X and Y directions, which are orthogonal to each other.

In the active anti-vibration system of FIG. 1, the anti-vibration table 1 on which a precise machine is mounted is supported horizontally and has its vibrations diminished by the supporting mechanisms 2a, 2b, 2c and 2d, having spring and damper characteristics. Any vibration of this table 1 is detected by the vibration sensors 4a, 4b, 4c and 4d, and the detection outputs of these sensors are compensated for and fed back to the actuators 3a, 3b, 3c and 3d, whereby the vibration of the anti-vibration table 1 is controlled actively.

Here, the directions of freedoms of the supporting mechanisms 2a, 2b, 2c and 2d and of the actuators 3a, 3b, 3c and 3d, as well as the directions of disposition of the vibration sensors 4a, 4b, 4c and 4d, form an angle $\Theta$ rad or $(\pi-\Theta)$ rad with respect to the X direction, as illustrated in FIG. 1, and the supporting mechanisms and the actuators as well as the vibration sensors are disposed geometrically symmetrically. Here, the angle $\Theta$ is so determined that, when the X-Y stage is driven in the X and Y directions and if the maximum control forces as required in respective directions of freedoms for the active anti-vibration system are denoted by $F_x$ and $F_y$, the following relation is satisfied:

$$\Theta = \tan^{-1}(F_y/F_x) \tag{1}$$

Figure 3A:
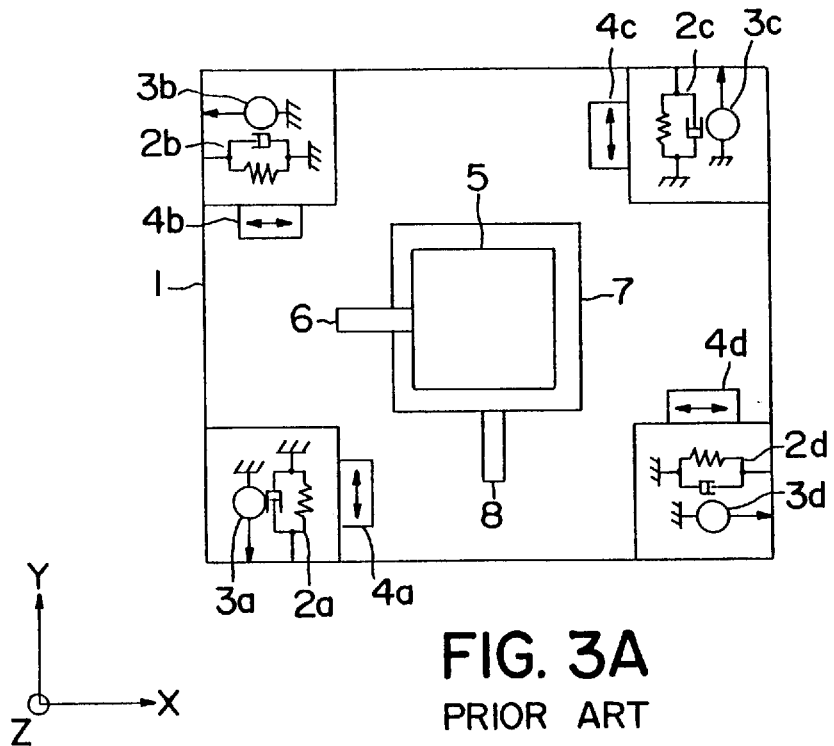
FIGS. 3A and 3B are a top plan view of a known example of an active anti-vibration system.
Figure 3B:
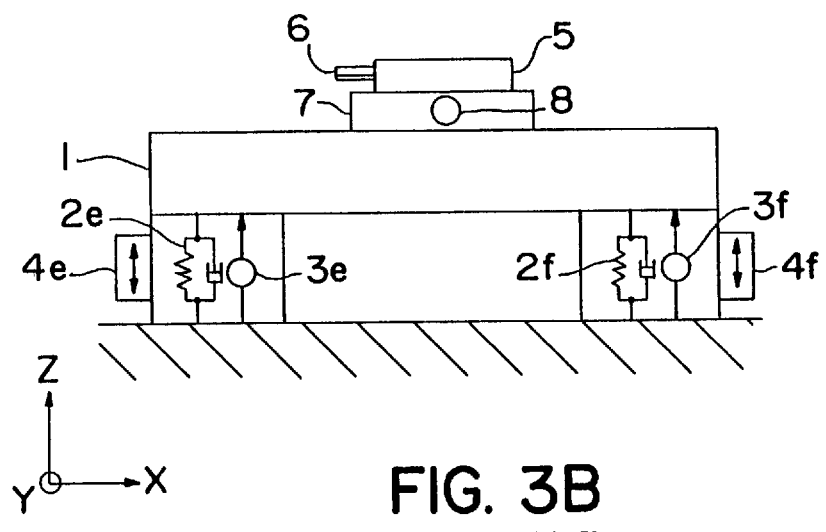

By doing so, an external force such as a drive reactive force of the X-Y stage, is distributed uniformly to the supporting mechanisms 2a, 2b, 2c and 2d and the actuators 3a, 3b, 3c and 3d, regardless of the direction of the drive force, such that the maximum thrust of each actuator can be made a minimum, as necessary. Namely, in the case of conventional active anti-vibration system, such as shown in FIG. 3, vibration produced in response to the driving of the X-Y stage in the X or Y direction is controlled mainly by two actuators in the X or Y direction. As compared therewith, in the active anti-vibration system according to the present invention, regardless of the driving method of the mounted machine, vibration is controlled by distributing the thrust uniformly to the four actuators 3a, 3b, 3c and 3d disposed horizontally. Thus, in the present invention, the maximum thrust required for each actuator is made a minimum, as necessary.

Now, referring to FIG. 1, the operation of this active anti-vibration system will be explained while taking, as an example, a case where the X-Y stage mounted on the anti-vibration table 1 and having the X stage 5, the X stage driving means 6, the Y stage 7 and the Y stage driving means 8, is driven in the X direction.

As the X-Y stage is driven in the X direction, namely, as the X stage 5 is driven by the X-stage driving means 6, due to the drive reactive force thereof, the anti-vibration table 1 vibrates mainly in the X direction. This vibration is detected by the vibration sensors 4a, 4b, 4c and 4d and, after being appropriately compensated for, it is fed back to the actuators 3a, 3b, 3c and 3d and is controlled thereby. The drive reactive force of the X stage 5 may produce vibration of the anti-vibration table 1 in a rotational mode, such as pitching or yawing or vibration in the Y direction or vertical direction, and in that case, it is controlled by means of the vibration sensor 4a, 4b, 4c and 4d and the actuator 3a, 3b, 3c and 3d disposed horizontally as well as vibration sensors and actuators, not shown in FIG. 1, disposed vertically. However, in the case where the X-Y stage is driven in the X direction, vibration in X direction is dominant and thus the active anti-vibration system is mainly under the control of the control force produced in the X direction. In the present invention, the angle $\Theta$ is determined in accordance with equation (1) and, on the basis of this, the actuators are disposed such as shown in FIG. 1. With this arrangement, the control force for controlling the vibration mainly in the X direction is uniformly distributed to the actuators 3a, 3b, 3c and 3d, such that the maximum thrust of each actuator can be controlled.

A similar operation is made as the X-Y stage is driven in the Y direction. Namely, as the Y stage 7 is driven by the Y stage driving means 8, vibration of the anti-vibration table 1 mainly in the Y direction, due to the drive reactive force thereof, is detected by the vibration sensors 4a, 4b, 4c and 4d and, after being compensated for appropriately, it is fed back to the actuators 3a, 3b, 3c and 3d and is controlled thereby.

Here, the maximum thrust of each actuator is $F_x/4 \cos \Theta$ (for X direction drive of the X-Y stage) or $F_y/4 \sin \Theta$ (for Y direction drive of the X-Y stage). However, from the relation of equation (1), the maximum thrusts of each actuator in the X direction driving and Y direction driving of the X-Y stage are equal to each other. Namely, by defining such an angle as described hereinbefore between the direction of freedom of the mounted machine, such as the X-Y stage and the direction of disposition of each actuator, it is assured that, regardless of the direction in which the mounted machine is driven, an external force, such as a drive reactive force is distributed uniformly to a larger number of supporting mechanisms, supporting the anti-vibration table, and more actuators. On the other hand, in the case of the conventional active anti-vibration system shown in FIGS. 3A and 3B, where in each of the X and Y directions, the vibration control is performed by two actuators, the maximum thrust of the actuators 3b and 3d during X direction driving of the X-Y stage is $F_x/2$, and the maximum thrust of the actuators 3a and 3c during the Y direction driving of the X-Y stage is $F_y/2$. Comparing these thrusts, when $\Theta<\pi/4$, $F_x$ becomes larger than $F_y$, but the maximum thrust of each actuator of the active anti-vibration system with the freedoms of the mounted machine having been taken into account becomes smaller than $F_x/2.828$, and it is smaller than the maximum thrust $F_x/2$ of the actuator in the X direction of the conventional active anti-vibration system. Similarly, when $\Theta>\pi/4$, $F_y$ becomes larger than $F_x$, but the maximum thrust of each actuator of the active anti-vibration system with the freedom of the mounted machine having been taken into account becomes smaller than $F_y/2.828$, and it is smaller than the maximum thrust $F_y/2$ in the Y direction of the conventional active anti-vibration system. Particularly, when $\pi/6<\Theta<\pi/3$, the maximum thrust of each actuator of the active anti-vibration system with the freedom of the mounted machine having been taken into account becomes smaller than the maximum thrust of the actuator of the conventional active anti-vibration system shown in FIG. 3, both in the case of the X direction drive of the X-Y stage and in the case of the Y direction drive of the X-Y stage.

Thus, by optimizing the directions of freedoms of the active anti-vibration system while taking into account the directions of freedoms of the mounted machine and the drive reactive force in each direction of freedom, the maximum thrust required for each actuator for applying the control force to the anti-vibration table can be made a minimum, as necessary. As a result, without enlargement of the size of the actuator or without use of additional actuators, in each direction of freedom of the mounted machine a larger control force, as compared with that attainable with the conventional system, is obtainable. Also, the actuator output can be reduced. Thus, the cost of the constituent elements of the active anti-vibration system can be reduced.

The present invention is not limited to the form of the above-described embodiment, but it can be modified appropriately in many ways. For example:

(1) In the embodiment described above, the supporting mechanisms 2a, 2b, 2c and 2d form, as well as the actuators 3a, 3b, 3c and 3d, a certain angle $\Theta$ rad or $(\pi-\Theta)$ rad with respect to the X direction. The direction of disposition of each supporting mechanism may be changed so that, for example, it corresponds to the direction of freedom of the mounted machine, such as an X-Y stage.

(2) In the embodiment described above, vibration of an anti-vibration table is detected by vibration sensors and is compensated for, to thereby control the vibration of the anti-vibration table. However, the actuator disposition in the active anti-vibration system as well as the process of determining the direction of disposition thereof in the present invention may be applied to an active anti-vibration system wherein a position sensor or sensors are used to detect a positional deviation of the anti-vibration table for compensation thereof and, after adding it to a signal having vibration compensated for, the resultant signal is fed back to the actuators so that vibration control of the anti-vibration table, as well as position control (attitude control) are performed. The process of determining the direction of freedom of the active anti-vibration system in that case may be the same as that in the above-described embodiment.

Figure 2:
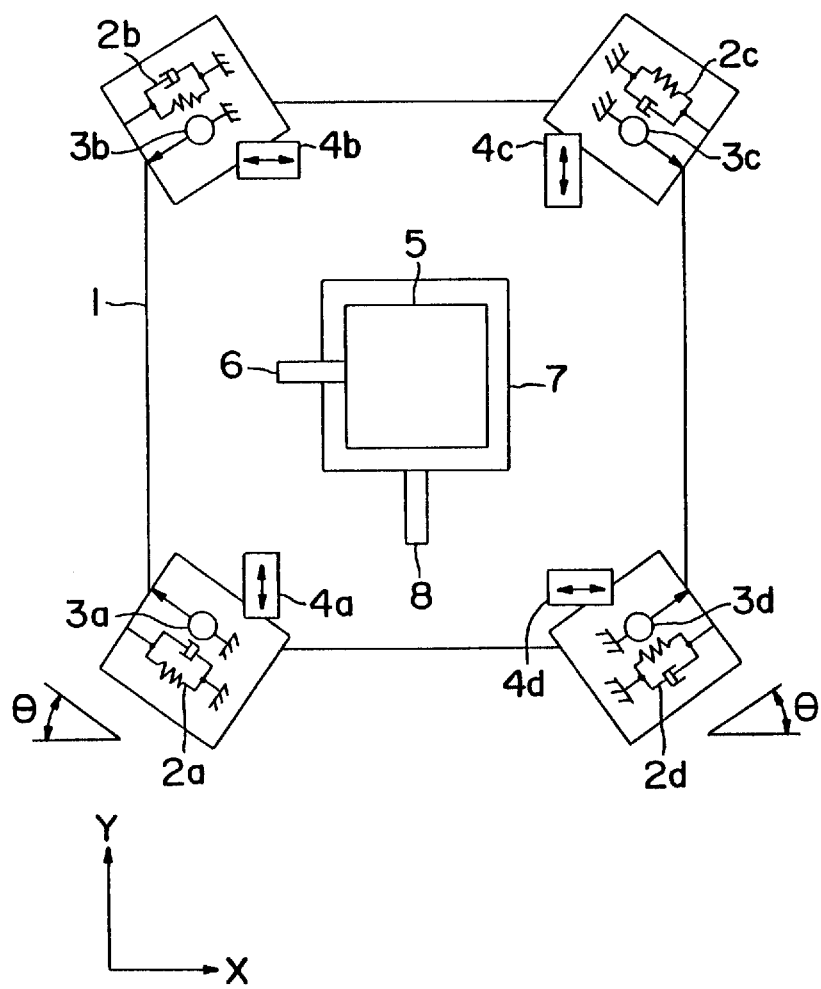
FIG. 2 is a top plan view, schematically showing a modified form of the anti-vibration system of the FIG. 1 embodiment.

(3) The vibration sensors or position sensors each may be disposed in a direction (e.g. in the direction of freedom of the X-Y stage) which is different from the directions of the supporting mechanisms for supporting the anti-vibration table or the directions of actuators, and the signals of the sensors may be compensated for appropriately on the basis of the positional relationship between the sensors and the actuators. FIG. 2 illustrates an embodiment corresponding to this.

In the embodiment shown in FIG. 2, an anti-vibration table 1 on which a precise machine is mounted is supported horizontally and has its vibrations controlled by supporting mechanisms 2a, 2b, 2c and 2d, having spring and damping characteristics, as in the preceding embodiment. Vibration of this anti-vibration table 1 is detected by vibration sensors 4a, 4b, 4c and/or 4d each disposed in the X or Y direction, corresponding to the directions of freedoms of the X-Y stage, and is compensated for. It is fed back to actuators 3a, 3b, 3c and 3d disposed at an angle $\Theta$ rad or $(\pi-\Theta)$ rad with respect to the X direction, by which vibration of the anti-vibration table 1 is controlled actively. Here, the signals as produced by the sensors 4a, 4b, 4c and 4d are compensated appropriately by means of a control computing means, not shown in FIG. 2, in accordance with the direction of disposition of each sensor and each actuator as well as the positional relationship of them. Drive signals obtained thereby are distributed to the actuators 3a, 3b, 3c and 3d. In this case, as the process for compensating for the sensor signals and distributing drive signals to the actuators, kinetic motion mode dependent control computing means may desirably be used, which is capable of extracting or discriminating the kinetic motion mode such as horizontal motion, rotational motion, or otherwise of the anti-vibration table from the sensor signals, and is capable of compensating for it and distributing the amount of operation corresponding to the extracted kinetic motion mode to the respective actuators.

While the invention has been described with reference to the structures disclosed herein, it is not confined to the details set forth and this application is intended to cover such modifications or changes as may come within the purposes of the improvements or the scope of the following claims.

What is claimed is:

1. An anti-vibration system for providing optimum placement of actuators applying a control force to an anti-vibration table mounting a machine subject to unequal driving forces in the X and Y directions, said system comprising:

an anti-vibration table on which a machine having directions of freedom in X and Y directions is mounted, wherein when control forces required for driving the machine in the X and Y directions are $F_x$ and $F_y$, respectively, the relation $F_x \neq F_y$ is satisfied; and a plurality of actuators for applying a control force to said anti-vibration table to actively control vibration of said anti-vibration table, wherein a drive reactive force applied to said anti-vibration table during driving of the machine is distributed to said actuators, wherein each actuator has a direction of freedom forming an angle $\Theta$ with respect to the X or Y direction, wherein the angle $\Theta$ is determined on the basis of the control force $F_x$ required for driving the machine in the X direction and on the basis of the control force $F_y$ required for driving the machine in the Y direction, wherein $(\pi/6) < \Theta \neq (\pi/4)$ and $(\pi/6) < \Theta < (\pi/3)$.

2. A system according to claim 1, wherein the machine comprises X and Y stages, wherein the X stage is movable in the X direction and the Y stage is movable in the Y direction.

3. A system according to claim 2, further comprising a vibration sensor for detecting vibration of said anti-vibration table, wherein said actuators produce a force for actively controlling vibration of said anti-vibration table in the directions of freedom in accordance with an output of said vibration sensor.

4. A system according to claim 3, further comprising a position sensor for detecting displacement of said anti-vibration table with respect to a reference position, wherein said actuators are controlled in accordance with an output of said position sensor.

5. A system according to claim 1, wherein the drive reaction force applied to said anti-vibration table during driving of the machine is uniformly distributed to said actuators, and wherein the angle $\Theta$ satisfies the relation $\Theta = \tan^{-1}(F_y/F_x)$.

* * * * *

UNITED STATES PATENT AND TRADEMARK OFFICE
CERTIFICATE OF CORRECTION

PATENT NO.   :   5,812,958
DATED        :   September 22, 1998
INVENTOR(S)  :   Takehiko MAYAMA It is certified that error appears in the above-identified patent and that said Letters Patent is hereby corrected as shown below:

COLUMN 1:

Line 39, "a active" should read --an active--.

COLUMN 5:

Line 37, "are" should read --is--.
   Line 50, "are" should read --is--.

COLUMN 6:

Line 25, "of" should read --of a--.

Signed and Sealed this

Twenty-fifth Day of May, 1999

Attest:

Q. TODD DICKINSON

*Attesting Officer*   *Acting Commissioner of Patents and Trademarks*